United States Patent
Ito et al.

(10) Patent No.: US 8,143,573 B2
(45) Date of Patent: Mar. 27, 2012

(54) CHARGED PARTICLE BEAM APPARATUS

(75) Inventors: Sukehiro Ito, Hitachinaka (JP); Junichi Katane, Naka (JP); Shigeru Kawamata, Hitachinaka (JP); Shinichi Tomita, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 491 days.

(21) Appl. No.: 12/490,775

(22) Filed: Jun. 24, 2009

(65) Prior Publication Data

US 2009/0322973 A1 Dec. 31, 2009

(30) Foreign Application Priority Data

Jun. 26, 2008 (JP) ................. 2008-167023

(51) Int. Cl.
*G02F 1/1335* (2006.01)
*G01K 1/08* (2006.01)
(52) U.S. Cl. ......... 250/305; 250/310; 250/397; 250/399
(58) Field of Classification Search .................. 250/305, 250/310, 397, 399
See application file for complete search history.

(56) References Cited

U.S. PATENT DOCUMENTS 7,973,282 B2 * 7/2011 Sato et al. ..................... 250/311
7,999,565 B2 * 8/2011 Gunji et al. .............. 324/754.22

FOREIGN PATENT DOCUMENTS

| JP | 55-48610 | 3/1980 |
| JP | 02-033843 | 2/1990 |
| JP | 2006-012664 | 1/2006 |

* cited by examiner

*Primary Examiner* — Tony Ko
(74) *Attorney, Agent, or Firm* — McDermott Will & Emery LLP (57) ABSTRACT

A charged particle beam impinging on a specimen is set to have left and right tilt angles corresponding to a parallactic angle. A control unit is provided which scans the beam over the specimen while giving a left tilt and a right tilt corresponding to the parallactic angle alternately to the beam on each scanning line. In this way, images are acquired. A three-dimensional image in which deterioration of the resolution is suppressed is displayed in real time by combining aberration cancellation means with the control of the beam according to the parallactic angle. The aberration cancellation means uses an optical system having plural stages of lenses to provide overall cancellation of aberrations by making use of the action of a lens to deflect the beam back to the optical axis.

20 Claims, 9 Drawing Sheets

SCANNED IMAGE OBTAINED BY
BEAM WITH LEFT TILT ANGLE

FIG.4B

SCANNED IMAGE OBTAINED BY
BEAM WITH RIGHT TILT ANGLE

⊠ UPPER STAGE OF DEFLECTION COIL

⊠ LOWER STAGE OF DEFLECTION COIL
OBJECTIVE LENS

CHARGED PARTICLE BEAM APPARATUS

BACKGROUND OF THE INVENTION

The present invention relates to a charged particle beam apparatus for controllably scanning a charged particle beam (such as an electron beam or ion beam) over a specimen to obtain a final image and, more particularly, to a charged particle beam apparatus adapted to obtain stereoscopic, three-dimensional images.

In a charged particle beam apparatus typified by a scanning electron microscope, a sharply focused charged particle beam is scanned over a specimen to obtain desired information (e.g., images of the specimen) from the specimen. In such a charged particle beam apparatus, stereoscopic imaging has been heretofore done utilizing a crossed view method, a parallel view method, or an anaglyph method using the human eye visual perception. In the crossed method or parallel method, the specimen is tilted left and right with respect to the scanning beam. Two still images or two still photographs are acquired from different orientations. Then, stereo viewing is achieved by making use of the parallax between the left and right eyes. In the anaglyph method, red-blue glasses are used.

In the prior art, in a case where a two-dimensional image is obtained by scanning a charged particle beam, it is customary to control the beam for the scanning such that the optical axis of the beam passes through the axis of the objective lens. In recent years, a novel scanning technique has been proposed. In particular, the charged particle beam is tilted about a given position on the axis of the optical system by a deflection coil. That is, a tilt angle is given to the beam to achieve beam rocking. The tilted beam is off-axis incident on the objective lens. The objective lens rocks the beam back to its original posture. In this way, the charged particle beam is scanned over the specimen. Techniques regarding correction concomitant with the off-axis aberration and optical axis adjustment are also proposed.

In the field of general image display devices, techniques that can be applied for stereoscopic imaging have evolved in their respective technical fields because of appearance of three-dimensional liquid crystal displays. It is easy to forecast that a shift will be made from the era of stereoscopic imaging relying on the prior-art capturing of photographs to the era of real-time stereoscopic imaging by combining those techniques. Especially, in scanning electron microscopy, real-time stereoscopic imaging will find wide application. In the prior art, flat two-dimensional images (so-called general scanning electron microscope images) have been acquired. Accordingly, in the fields of bioscience and metal materials, there is a strong demand for a technique permitting evaluation of images having information in the thickness and depth directions while making an observation. The present invention is directed towards this technique.

Typical examples of the prior art are disclosed in JP-U-55-48610 and JP-A-2-33843. A technique consisting of irradiating a specimen with a tilted charged particle beam and employing the action of the objective lens rocking the beam back to its original posture at off-axis positions is known. An optical axis adjusting means appropriate for this technique is disclosed in JP-A-2006-12664. In particular, a combination of plural lenses and cancellation means are derived. The cancellation means analytically resolves the behavior of a charged particle beam off-axis incident on an objective lens and thus permits optical components to provide overall cancellation of aberrations produced when the beam is tilted over the specimen. This is well known as an imaging method utilizing tilt of beam on one side of the axis and has been already put into practical use.

SUMMARY OF THE INVENTION

In the prior art disclosed as described above, aberrations produced when the charged particle beam is tilted over the specimen are canceled in an overall manner by the action of the objective lens rocking the beam back to its original posture at off-axis positions, as well as by means of the combination of plural lenses and appropriate optical axis adjusting means. Any of the above techniques is well known as means useful in cases where the beam is tilted. However, no mention is made of their specific applications. Hence, these prior art techniques fail to meet the foregoing demands in those applications.

On the other hand, methods of stereoscopic imaging include a method of imaging that tilts a specimen itself by an angle corresponding to the parallactic angle and applies a crossed view method, parallel view method, or anaglyph method to the acquired images. Parallactic angles adapted for stereoscopic imaging are generally about 3° to 5°. However, various harmful effects are produced in acquiring left-right symmetric images. Insufficient reproducibility of the field of view, a growing worse in the symmetry of the image pair due to insufficient reproducibility of the tilt angle of the imaged subject, and a growing worse in the brightness symmetry due to an excessive increase in the contrast caused by damage to the specimen have placed limitations on stereoscopic imaging relying on the prior art.

Accordingly, it is an object of the present invention to provide a charged particle beam apparatus which can create a stereoscopic image from images obtained by beam tilt corresponding to the left-right parallax by making an overall use of these useful prior art techniques and which can be used in a method of real-time stereoscopic imaging.

The above-described object is achieved by noticing providing control of the beam by tilting a charged particle beam directed at a specimen without tilting the specimen itself. Especially, a charged particle beam apparatus adapted to obtain high-resolution images is built. The apparatus provides real-time stereoscopic imaging from acquired left-right parallax image data by tilting the primary charged particle beam left and right by an angle corresponding to the parallactic angle and suppresses deterioration of the resolution even though the beam is tilted.

The present invention provides a charged particle beam apparatus which is fundamentally comprised of a charged particle beam source producing a primary charged particle beam, a charged particle optical system, detection means, and a control unit. The charged particle optical system includes plural lenses and acts to focus the primary charged particle beam and to scan the beam over a specimen. The detection means detects secondary charged particles produced from the specimen in response to the scanning of the beam. The control unit controls the lenses. An image of the specimen is obtained using a detection signal produced from the detection means in response to the detected secondary charged particles.

The control unit has parallactic angle scanning control means and parallax image formation means. The parallactic angle scanning control means sets a left tilt angle and a right tilt angle corresponding to the parallactic angle via the charged particle optical system for the primary charged particle beam incident on the specimen and controls the primary charged particle beam such that the left and right tilt angles are alternately given to the beam on each scanning line on the specimen during the scanning. The parallax image formation means acquires left and right parallax images based on the detection signal produced from the detection means in response to the detected secondary charged particles under the control of the scanning.

For example, the parallactic angle scanning control means controls the left and right tilt angles corresponding to the parallactic angle on each scanning line during the scanning by controlling the primary charged particle beam in such a way that a scan is made at the left tilt angle and a scan is made at the right tilt angle on the same scanning line (i.e., two scans are made to correspond to the parallactic angle) during the scanning of the specimen.

Another fundamental means for achieving the above-described object is a charged particle beam apparatus having a charged particle beam source producing a primary charged particle beam, a charged particle optical system, detection means, and a control unit. The charged particle optical system includes plural lenses and acts to focus the primary charged particle beam and to scan the beam over a specimen. The detection means detects secondary charged particles produced from the specimen in response to the scanning of the beam. The control unit controls the lenses. An image of the specimen is obtained using a detection signal produced from the detection means in response to the detected secondary charged particles.

The control unit has parallactic angle scanning control means and parallax image formation means. The parallactic angle scanning control means sets a left tilt angle and a right tilt angle corresponding to the parallactic angle via the charged particle optical system for the primary charged particle beam incident on the specimen and controls the primary charged particle beam in such a way that the beam is scanned at the left tilt angle on even- or odd-numbered scanning lines and that the beam is scanned at the right tilt angles on odd- or even-numbered scanning lines during scanning on the specimen. The parallax image formation means acquires left and right parallax images based on the detection signal produced from the detection means in response to the detected secondary charged particles under the control of the scanning.

According to the present invention, a stereoscopic image is created from images derived by beam tilting corresponding to the angle of the left-right parallax. Consequently, real-time stereoscopic imaging and its application are made possible.

DETAILED DESCRIPTION OF THE INVENTION

Embodiments of the present invention are hereinafter described with reference to the drawings.

Figure 1:
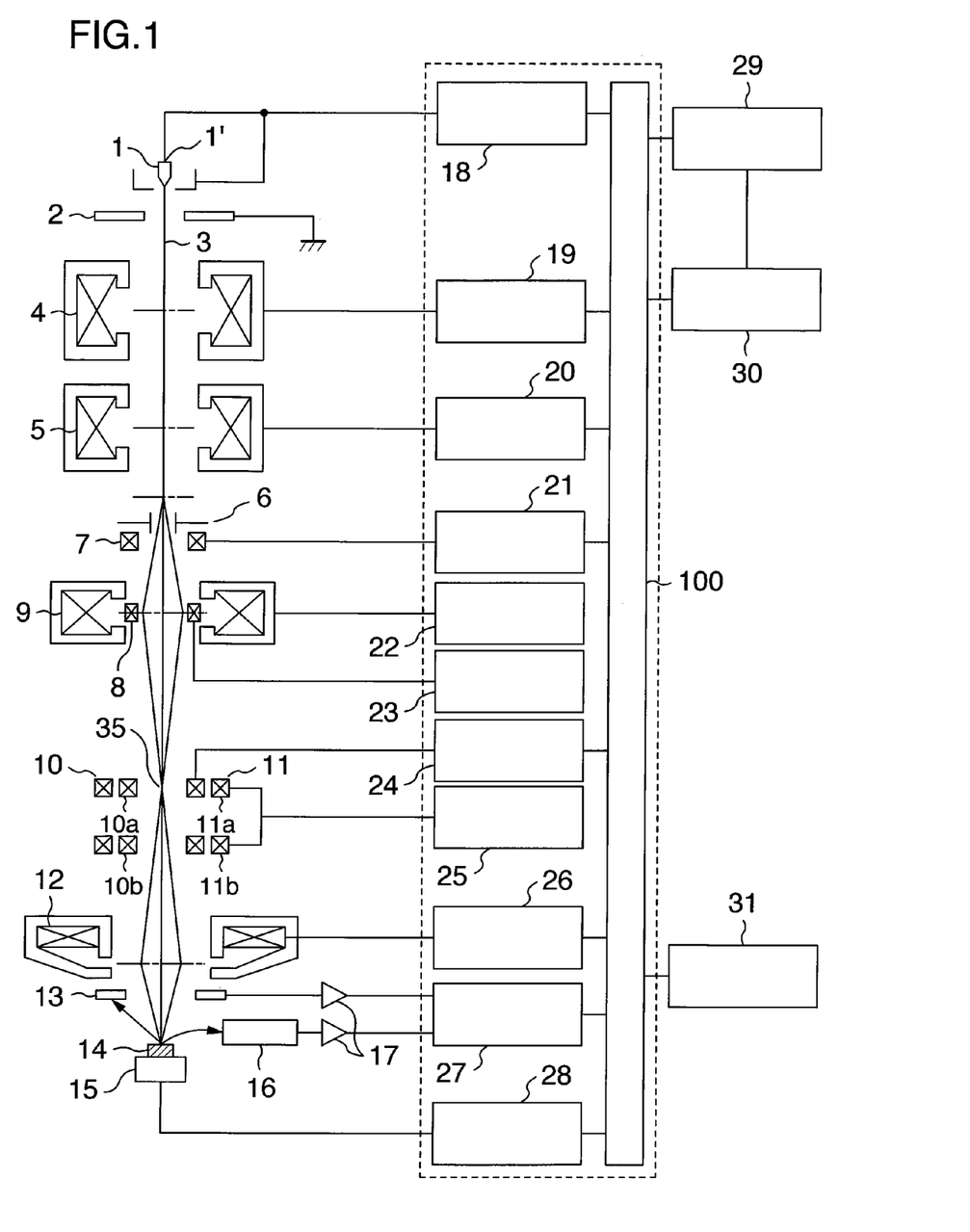
FIG. 1 is a schematic diagram of a scanning electron microscope shown as one specific example of a charged particle beam apparatus according to one embodiment of the present invention.

FIG. 1 is a schematic diagram of a scanning electron microscope according to one embodiment of the present invention.

The microscope has an electron gun 1' forming a charged particle beam source. The gun 1' is comprised of a cathode 1 and an anode 2. The microscope further includes a high-voltage control power supply 18 that applies a voltage between the cathode 1 and the anode 2 under control of a computer 28 acting as a control unit. A primary electron beam 3 acting as a primary charged particle beam is extracted from the cathode 1 and accelerated and guided toward a rear stage of lenses via acceleration anodes (not shown).

The primary electron beam 3 is focused by a first condenser lens 4 under control of a first condenser lens control power supply 19 and further focused by a second condenser lens 5 under control of a second condenser lens control power supply 20. Then, undesired regions of the primary electron beam 3 are removed by an aperture 6 and guided into a first beam tilt angle control coil (first beam deflecting coil) 7 controlled by a first beam tilt angle control power supply 21.

The first beam tilt angle control coil 7 and a third condenser lens 9 in a stage located under the first control coil 7 have the following functions. One function is to bring the primary electron beam 3 into focus at a position that should be the object point 35 of an objective lens 12 lying on the axis of a second beam tilt angle control coil (second beam deflecting coil) 10 included in a following stage of parallactic angle scanning control optical system. Another function is to provide the function of a beam tilt angle coil for tilting the beam (i.e., aberration correction). The tilting produces an aberration in an upper stage of the objective lens to cancel out off-axis aberrations (comatic aberration and off-axis chromatic aberration) in the objective lens 12 produced when the primary electron beam 3 is made to hit an off-axis position of the objective lens 12 by the second beam tilt angle control coil 10 (e.g., when the primary electron beam 3 is in a deflected orbit shown in gray (indicated by the dotted areas) in FIG. 2) while the object point (beam-rocking point) 35 of the objective lens 12 is used as the point of deflection.

Especially, in the present embodiment, when the scanning is controlled using the left and right beam tilt angles corresponding to the parallactic angle for the primary electron beam 3 by the use of the second tilt angle control coil 10 and objective lens 12 as described later, aberrations for canceling out the comatic aberration and off-axis chromatic aberration simultaneously are created. The comatic aberration and off-axis chromatic aberration are produced off the axis of the objective lens. Correction of the off-axis aberrations produced in the objective lens 12 (i.e., optical axis adjustment) will be described in detail later. The third condenser lens 9 is equipped with a stigmator coil 8 having functions which will be described later. The current flowing through the first beam tilt angle control coil 7 is controlled by the tilt angle control power supply (aberration correction power supply) 21. The current flowing through the stigmator coil 8 is controlled by a stigmator power supply 23. The current flowing through the third condenser lens 9 is controlled by a third condenser lens control power supply 22.

The second beam tilt angle control coil (second deflection coil) 10 consisting of an upper stage of deflection coil 10a and a lower stage of deflection coil 10b is disposed around the position of the object point 35 of the objective lens 12. A scan coil assembly 11 consisting of an upper stage of scan coil 11a and a lower stage of scan coil 11b is disposed around the second beam tilt angle control coil 10 to scan the primary electron beam 3 over the specimen 14. The second beam tilt angle control coil 10 and scan coil assembly 11 are controlled by a beam tilt angle control power supply 24 and a scan coil control power supply 25, respectively.

In the present embodiment, the currents in the second beam tilt angle control coil 10 and scan coil assembly 11 are controlled by a computer (control unit) 100 via the beam tilt angle control power supply 24 and scan coil control power supply 25 to perform real-time stereoscopic scanning electron microscopy as described later. The microscopy means a mode of operation in which a primary beam (such as a charged particle beam (e.g., an electron beam or ion beam)) is controllably scanned over a specimen at left and right tilt angles corresponding to a parallactic angle, and in which left and right parallax images are derived for real-time three-dimensional imaging.

The orbit of the primary electron beam 3 shown in FIG. 1 is assumed when real-time stereoscopic scanning electron microscopy is not performed. That is, the first and second beam tilt angle control coils 7 and 10 are OFF. The currents in the third condenser lens 9 and objective lens 12 are controlled such that the beam 3 is brought to focus on the specimen on the center axis of the charged particle optical system. Under this condition, the second beam tilt angle control coil 10 is controlled in such a way that the primary beam 3 is incident at an off-axis position of the objective lens 12 at a tilt angle. An example of the orbit of the primary electron beam 3 assumed when the current in the first beam tilt angle control coil 7 is controlled to compensate for the off-axis aberrations (comatic aberration and off-axis chromatic aberration) produced in the objective lens 12 by the off-axis incidence is shown in gray in FIG. 2.

The computer 100 sets a left beam tilt angle and a right beam tilt angle corresponding to a parallactic angle for execution of the real-time stereoscopic scanning electron microscopy and controls the current in the second beam tilt angle control coil 10 to values corresponding to the set values via the beam tilt angle control power supply 24. That is, the computer 100 has a function of switching the angle of the primary electron beam 3 between the left tilt angle and right tilt angle corresponding to the parallactic angle. Simultaneously with the switching of the tilt angle between the left and right angles corresponding to the parallactic angle using the second beam tilt angle control coil 10, the computer 100 controls the scanning of the primary electron beam 3 via the scan coil assembly 11. Thus, the computer controls the scanning using the left and right tilt angles alternately on each scanning line on the specimen. For example, a scan at the left tilt angle and a scan at the right tilt angle are made on the same line on the specimen. That is, two scans are made. The computer 100 of the present embodiment has means for controlling the scans made at the left and right tilt angles corresponding to the parallactic angle on each line on the specimen via the second beam tilt angle control coil 10 and the scan coil assembly 11. The control of the scanning at the left and right tilt angles corresponding to the parallactic angle will be described in detail later.

The primary electron beam 3 is controlled by the scan coil control power supply 25 via the scan coil assembly 11. That is, horizontal and vertical deflection currents are controlled. The beam 3 is scanned in two dimensions over the specimen 14. Secondary electrons produced from the specimen 14 in response to the impingement of the primary beam 3 are separated from the primary electrons by a perpendicularly crossed field generator (not shown) for separation for secondary electrons and detected by a secondary electron detector 16. The output signal from the detector 16 is amplified by a signal amplifier 17 and applied to the computer 100 via a signal input unit 26.

When the scanning is controlled using the left and right beam tilt angles corresponding to the parallactic angle, the computer 100 acquires left and right parallax images (left and right tilt angle scanned images) based on the output signal from the secondary electron detector 16 by performing image processing. The left and right parallax images are stored in an image memory 30. The computer 100 implements three-dimensional processing of the parallax images and displays the resultant data as a stereoscopic image on a display device 29. The three-dimensional processing of the images will be described later.

In the present embodiment, backscattered electrons produced from the specimen by incidence of the primary electron beam 3 are also detected by a backscattered electron detector 13 and amplified by the signal amplifier 17. Then, the signal is applied to the computer 100 via a signal input unit 27. The signal indicating the backscattered electrons is image-processed as a backscattered electron image by the computer 100 and can be displayed on the display device 29.

An input device 31 is used to set conditions under which images are accepted (such as switching of imaging mode between 2D imaging and 3D imaging, scanning speed, and acceleration voltage).

In the present embodiment, in cases where the final magnification is below an arbitrarily set given magnification (such as ×10,000), the beam is scanned using the left and right tilt angles corresponding to the parallactic angle for the primary electron beam 3 on each scanning line as described later. The obtained left and right parallax images permit implementation of real-time stereoscopic imaging mode (real-time stereo scanning electron microscopy) via the display device 29. The apparatus has an imaging mode switching function to control the scanning of the charged particle beam in normal 2D imaging mode without implementing the control of the scanning using the left and right tilt angles corresponding to the parallactic angle when the final magnification exceeds the aforementioned given magnification.

The real-time stereoscopic scanning electron microscopy is described in detail below.

The primary electron beam 3 is made to impinge at the object point 35 of the objective lens 12 via the first beam tilt angle control coil 7 and third condenser lens 9. The scanning of the beam 3 is controlled on each scanning line, at off-axis positions of the objective lens 12, using the left and right tilt angles corresponding to the parallactic angle by controlling the second beam tilt angle control coil 10 and scan coil assembly 11.

More specifically, the primary electron beam 3 on the same scanning line on the specimen is so controlled that the beam makes two scans at the left tilt angle and right tilt angle, respectively, corresponding to the parallactic angle.

Figure 3A:
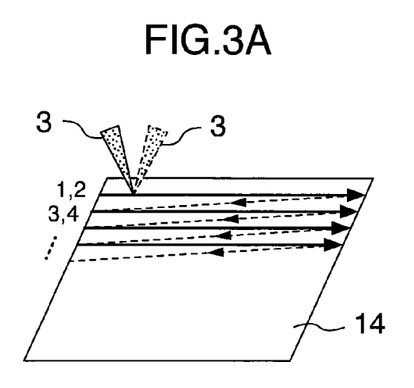
FIG. 3A illustrates the manner in which the beam is scanned at left and right tilt angles corresponding to a parallactic angle in accordance with the present invention.
Figure 3B:
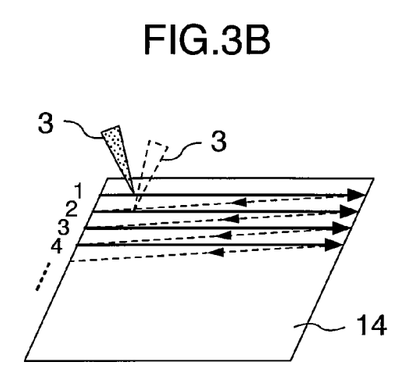
FIG. 3B illustrates the manner in which the beam is scanned by a parallactic angle scanning method instead of the method illustrated in FIG. 3A.

FIG. 3A illustrates the principle of the control method. For example, on each scanning line, the primary electron beam 3 is controlled to make a first scan at the left tilt angle as indicated by the solid line. The beam 3 is then controlled to make a second scan at the right tilt angle as indicated by the broken line. In the figure, the arrows of the bold solid lines indicate the scanning direction of the primary electron beam on each line. The arrows of the broken lines indicate the returning motion of the beam to the scanning start position on each line. The first scan by the electron beam 3 may be made at the right tilt angle, and the second scan by the beam 3 may be made at the left tilt angle. Numbers given to the left side of the specimen 14 in FIGS. 3A and 3B indicate the scanning numbers. Secondary electrons produced from the specimen in response to the scanning made at the left and right tilt angles corresponding to the parallactic angle in this way are detected by the secondary electron detector 16. The output signal from the detector 16 is image-processed by the computer 100.

Specifically, the computer 100 creates a left tilt angle scanned image (hereinafter may be referred to as a left tilt angle image) based on the output signal from the secondary electron detector obtained by the odd-numbered scans, i.e., scanning of the primary electron beam at the left tilt angle. The computer creates a right tilt angle scanned image (hereinafter may be referred to as a right tilt angle image) based on the output signal from the secondary electron detector obtained by the even-numbered scans, i.e., scanning of the primary electron beam at the right tilt angle. The left and right tilt angle images are combined into one in real time.

Figure 4A:
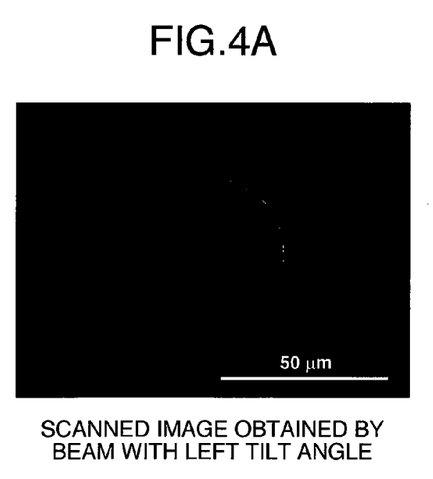
FIGS. 4A and 4B are SEM images of a cross section of a tungsten wire, taken by scanning using the left and right tilt angles of the beam.
Figure 4B:
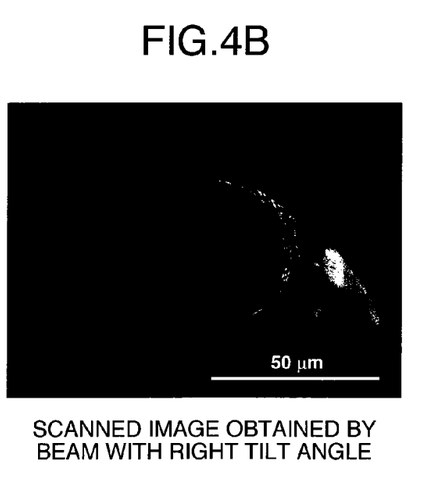

SEM micrographs indicating a left tilt angle image and a right tilt angle image, respectively, obtained by the image processing steps as described above are shown in FIGS. 4A and 4B, which are SEM images acquired by scanning a cross section of a tungsten wire with the beam at the left and right tilt angles. The tilt angle images are stored in the image memory 30. The left and right tilt angle images are processed as a stereoscopic image by the computer 100 and displayed as a stereo image on the display device 29 (such as a 3D LCD). The 3D LCD that is a typical example of the display device 29 is described later.

Figure 5A:
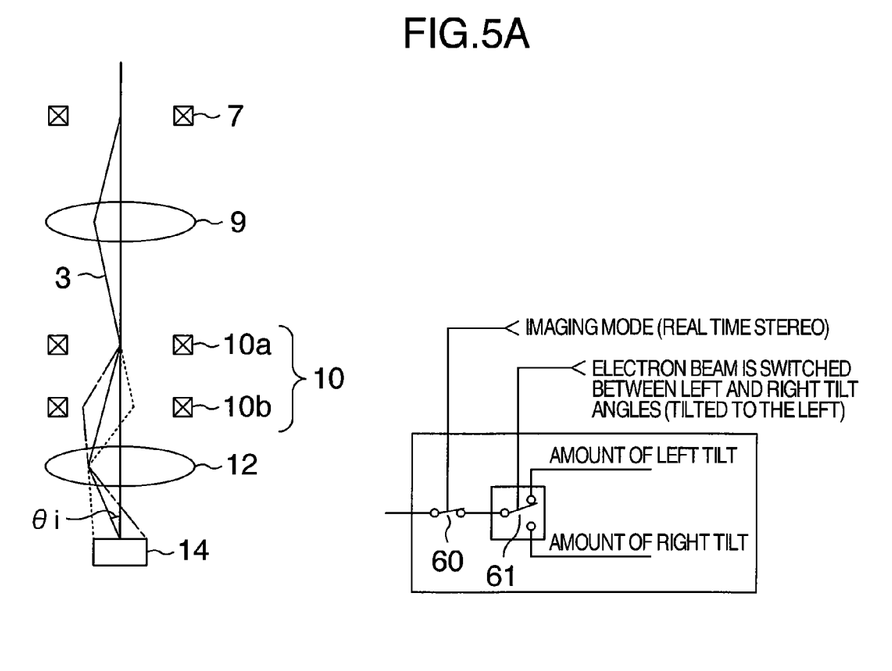
FIG. 5A is an electron ray diagram showing the orbit of the optical axis of the beam in a case where the primary electron beam is scanned at left and right tilt angles corresponding to a left-right parallax by the apparatus of the above embodiment, and in which the beam is being scanned at the left tilt angle.
Figure 5B:
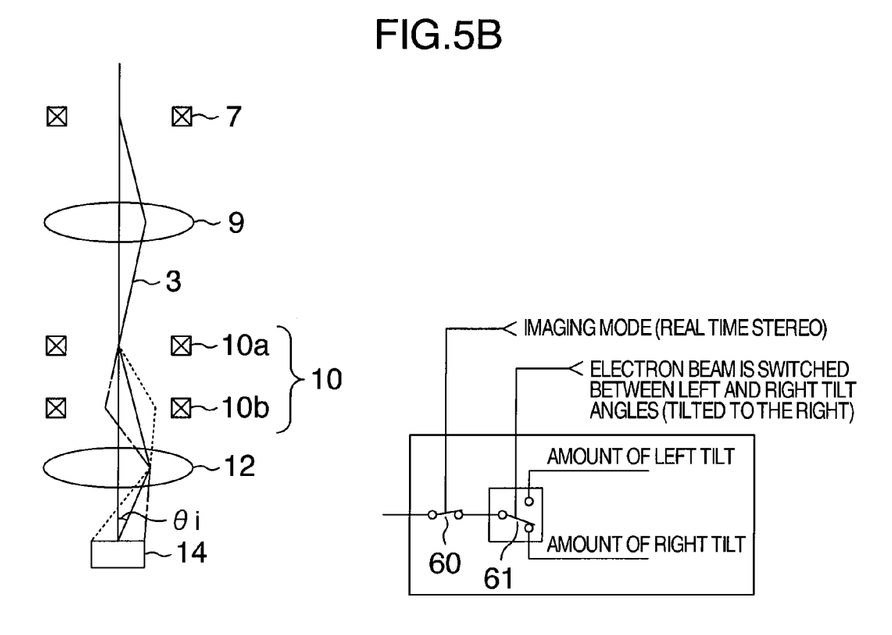
FIG. 5B is an electron ray diagram similar to FIG. 5A, but in which the beam is being scanned at the right tilt angle.

The electron ray diagram of FIG. 5A shows the optical axis of the beam when it is scanned at the left tilt angle in a case where real-time stereo scanning electron microscopy is performed. The circuit diagram of FIG. 5A shows the manner in which the tilt angle of the electron beam has been switched to the left tilt angle inside the computer 100. The electron ray diagram of FIG. 5B shows the optical axis of the beam when it is scanned at the right tilt angle in a case where real-time stereo scanning electron microscopy is performed. The circuit diagram of FIG. 5B shows the manner in which the tilt angle of the electron beam has been switched to the right tilt angle inside the computer 100.

The optical axis of the beam indicated by the solid line in the electron ray diagrams of FIGS. 5A and 5B is used when the primary electron beam 3 is controlled in terms of its tilt angle such that the image point of the objective lens 12 lies over the specimen on the center axis of the charged particle optical system. The parallactic angle ($\theta i$) providing a left-right reference is made between the center axis of the optical system and the intersecting optical axis of the beam tilted at each tilt angle when the optical axis of the tilted beam having the left or right tilt angle is deflected back to the center axis (indicated by the solid line in FIGS. 5A and 5B) of the charged particle optical system (objective lens) by the objective lens. The parallactic angle ($\theta i$) is set between 3° and 5°, for example. The primary electron beam 3 is scanned in a horizontal direction within the scanning range dictated by the parallactic angle ($\theta i \pm x$) as indicated by the optical axes of the dotted line and dot-and-dash line by controlling the two stages of scan coils 11a and 11b of the scan coil assembly 11 based on the parallactic angle ($\theta i$).

Figure 6:
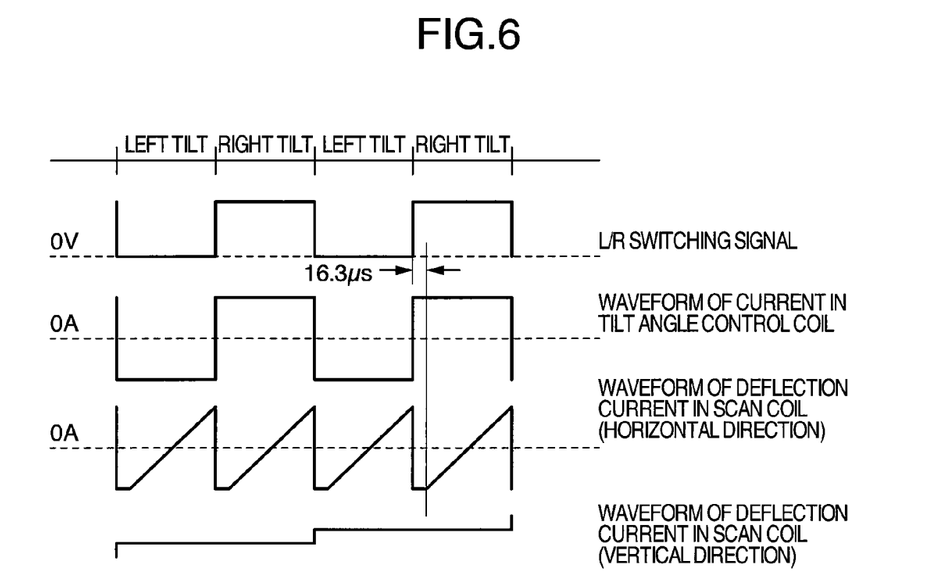
FIG. 6 is a time chart showing the waveforms of control signals in a case where the primary electron beam is scanned at left and right tilt angles corresponding to a left-right parallax by the apparatus of the above embodiment.

FIG. 6 is a time chart of a control signal for scanning the beam at the left and right tilt angles corresponding to the parallactic angle when the real-time stereoscopic scanning electron microscopy is performed.

Referring to FIG. 6, when a left-right switching signal is in a low level, for example, a negative current is fed into the second tilt angle control coil 10 to tilt the beam to the left. When the switching signal is in a high level, a positive current is fed into the second coil 10 to tilt the beam to the right. First, the primary electron beam is tilted by the left tilt angle, and the first line in the image is scanned by controlling the scan coil assembly 11 with a horizontal (X-direction) deflection current. Then, the beam is tilted by the right tilt angle, and the first line is similarly scanned. The beam is shifted to the second and third lines in a vertical (Y-direction) direction, and the scanning process described above is repeated. Consequently, left and right tilt angle images (parallax images) on each line can be obtained in real time. When the tilt angle of the electron beam is switched from the left tilt angle to the right tilt angle or vice versa, various parameters are switched on each individual line.

The amounts of the left and right tilts and the amounts by which the parameters are adjusted need to be switched at the timings of the rising and falling edges of the left-right switching signal. For example, they need to be switched within the period of each interval (e.g., 16.3 μs) in which those amounts are switched during the horizontal scanning of the beam.

The real-time stereoscopic scanning electron microscopy of the present embodiment adopts a method of beam tilt, known as a beam rocking technique. In this method, the crossover point of a primary beam (in this example, the primary electron beam) at which the beam is converged is held at the position of a tilt coil (in this example, the second beam tilt angle control coil 10). The beam is tilted while using the crossover point as the object point 35 of the objective lens 12 and as the point of deflection.

The primary beam 3 incident on the objective lens 12 off its axis (i.e., off-axis incidence) scans over the specimen while being deflected back to the axis by the objective lens 12. The beam tilt angle $\theta i$ over the specimen is the combination of a deflection angle $\theta 1$ by which the beam is deflected away from the optical axis by the upper stage of deflection coil 10a and an angle by which the beam is deflected back to the optical axis by the objective lens 12. Although it is possible to geometrically find the tilt angle of the beam from the beam path, a required parallactic angle can be obtained by experimentally finding the angle of the beam incident on the specimen in practice and controlling the beam to the deflection angle $\theta 1$ corresponding to the found angle. There is a proportional relationship between the value of electrical current (Idef) fed into the beam tilt control coil (upper stage of deflection coil) 10a and the deflection angle $\theta 1$. Also, there is a proportional relationship between the deflection angle $\theta 1$ and the beam tilt angle $\theta i$ over the specimen. Thus, we have $$\theta i = k \cdot \text{Idef} \quad (1)$$

where the coefficient k is the beam tilt angle over the specimen per unit current fed into the upper stage of deflection coil. The angle sensitivity is set to °/A. The beam can be accurately controlled by using a geometrically found, rough value or an experimentally found value as the coefficient k and using it for the control of the tilt angle of the beam that is deflected left and right.

Figure 2:
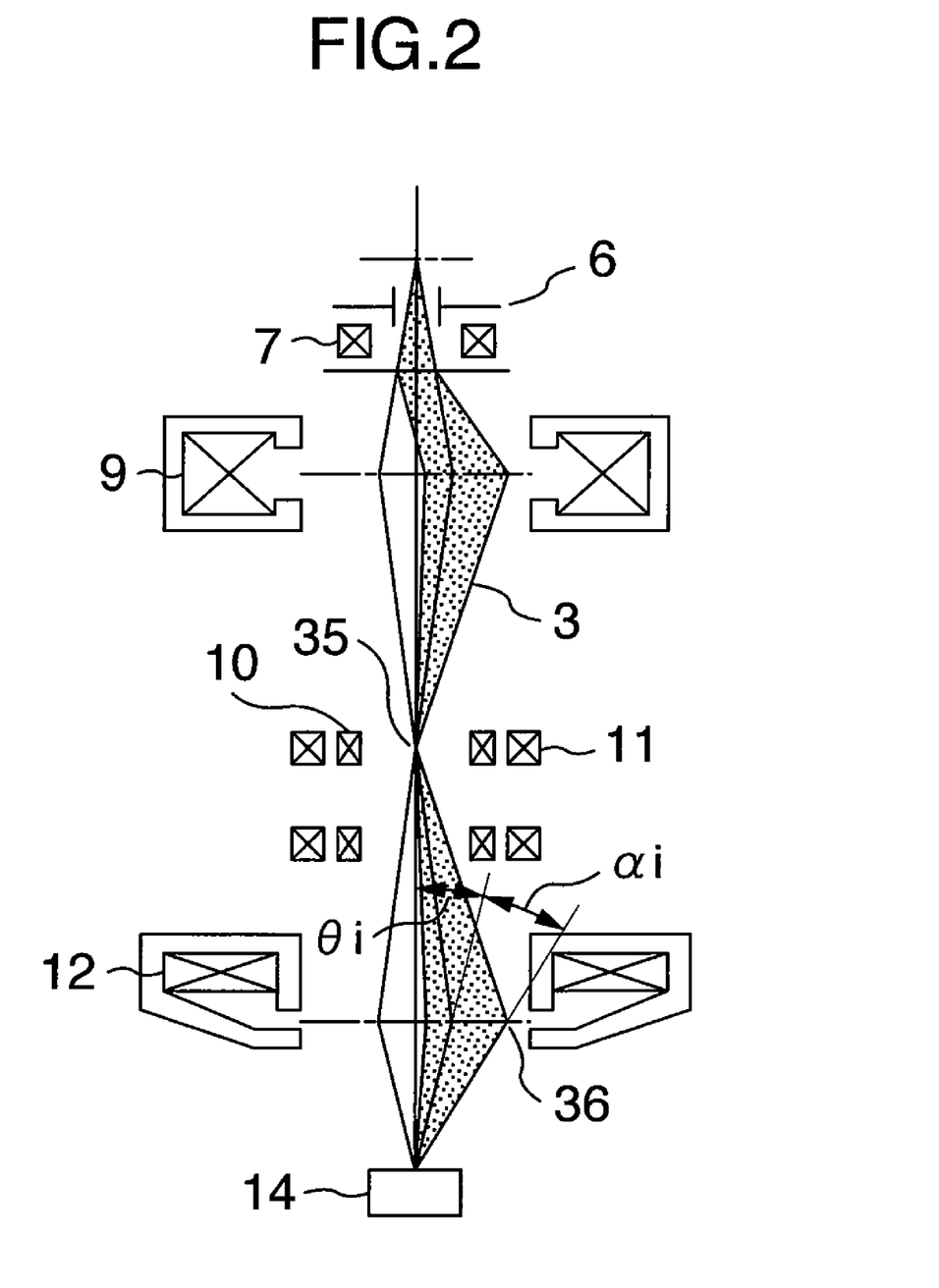
FIG. 2 is a diagram illustrating the operation of the primary electron beam in the scanning electron microscope of the above-described embodiment, particularly depicting the state in which a tilted electron beam hits a specimen at a position spaced from the axis of the objective lens (off-axis incidence)
Figure 15:
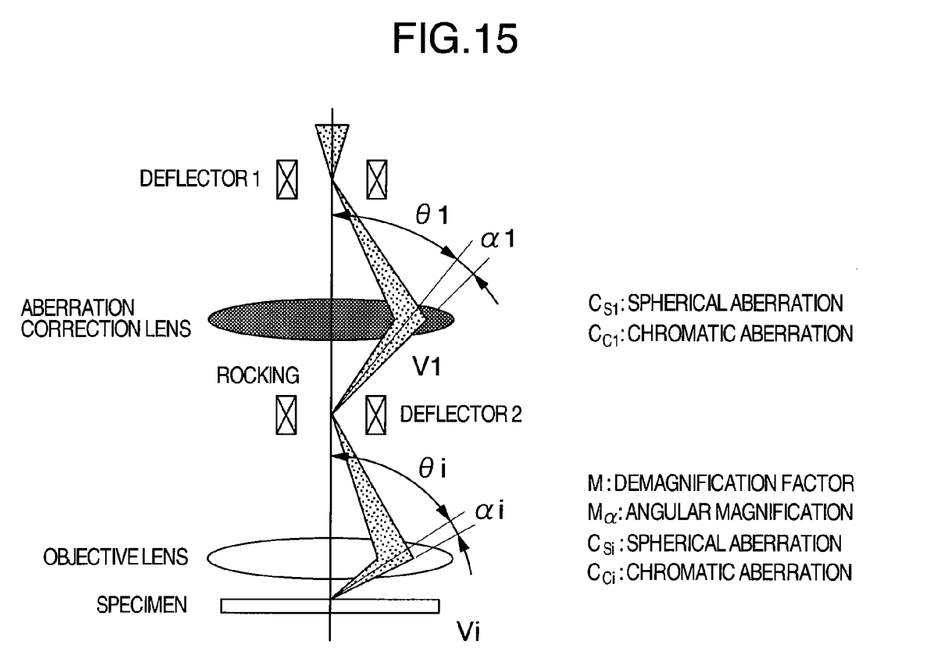
FIG. 15 is an electron ray diagram illustrating a method of correcting aberrations used when the parallactic angle scanning control of the above embodiments is implemented.

This concept can also be applied to the method in which aberrations produced when the beam is tilted over the specimen are overall canceled by components of the optical system. Specific examples of the method of application are shown in FIGS. 2, 5, and 15. Tilting of the beam corresponding to the parallactic angle and overall cancellation of aberrations using the components of the optical system are simultaneously done over the specimen in a manner described in detail later.

One advantage of the beam rocking technique is that aberrations produced when the beam is tilted can be calculated using the on-axis aberration coefficients (spherical aberration coefficient and on-axis chromatic aberration coefficient) because the object point of the objective lens and the image point are on the same axis. Another advantage is that it is easy to compute the resolution.

However, where the tilt of the beam deflected at the left and right tilt angles corresponding to the parallax images is controlled at the object point 35 of the objective lens 12 as in the present embodiment, the beam passes off the axis of the objective lens and so the off-axis aberrations (comatic aberration and off-axis chromatic aberration) increase. Accordingly, a countermeasure against the undesirable phenomenon is necessary.

The orbit of the primary electron beam 3 is shown in gray in FIG. 2. A stereoscopic image whose resolution deterioration has been suppressed can be acquired by combining a method of beam control (1) and aberration correction (2). In the method of beam control (1), the beam is controlled in a such a way that the beam impinges obliquely on the objective lens 12 while the optical axis of the beam is deflected away from the axis of the charged particle optical system by the second beam tilt angle control coil 10 and that the beam is deflected back to the axis of the optical system by the objective lens 12. In the aberration correction (2), comatic aberration and off-axis chromatic aberration produced over the specimen in the process (1) when the beam is controlled according to the parallactic angle are overall canceled out by the optical system of the plural stages of lenses including the first beam tilt angle control coil 7 and third condenser lens 9. In the geometry of FIG. 2, only the control of the beam tilted to the right according to the parallactic angle is shown. The control of the beam tilted to the left is not shown but implemented similarly.

Figure 9:
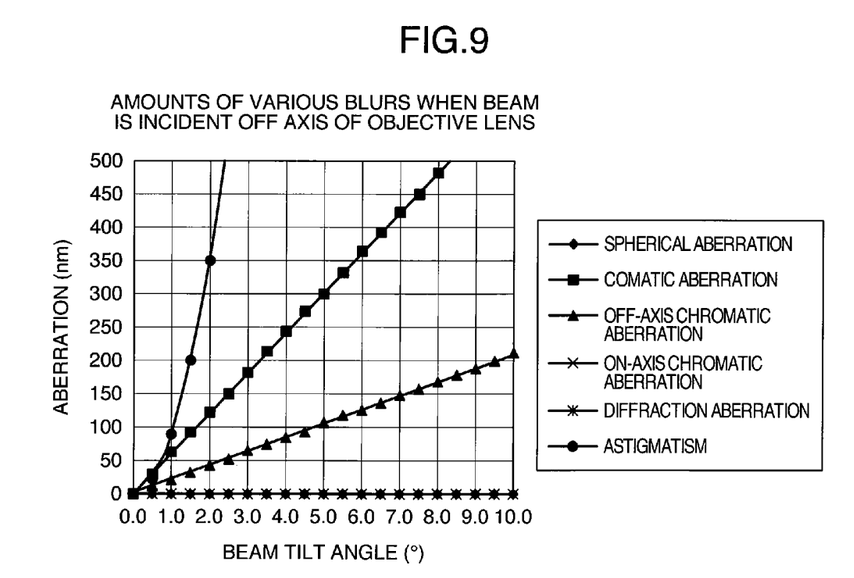
FIG. 9 is a graph in which the amounts of various aberration-induced blurs are plotted against beam tilt angle in a case where the beam is off-axis incident on the objective lens.

In the graph of FIG. 9, the amounts of blurs of the image due to aberrations are roughly compared in a case where the optical system (the first beam tilt angle control coil 7 and third condenser lens 9) for reducing or correcting aberrations is not mounted and where the primary electron beam 3 impinges obliquely on the objective lens 12 (off-axis incidence) such that the optical axis of the beam 3 is spaced from the principal axis of the objective lens (axis of the primary charged particle optical system).

As shown in the graph of FIG. 9, in a case where the tilted beam impinges in an off-axis manner, blurs arising from spherical aberration and chromatic aberration intrinsic to the objective lens decrease according to the beam tilt angle over the specimen in the order (i) blur due to astigmatism, (ii) blur due to chromatic blur, and (iii) blur due to off-axis chromatic aberration, successively. Means for suppressing deterioration of the resolution due to blurs caused by the aberrations are discussed below.

With respect to the (i) blur due to astigmatism, it is considered that the blur can be corrected by the stigmator coil 8. With respect to the (ii) blur due to chromatic blur and (iii) blur due to off-axis chromatic aberration, the method of correction using the configuration shown in FIGS. 2, 5A, 5B, 14, and 15 is considered to be best.

Figure 14:
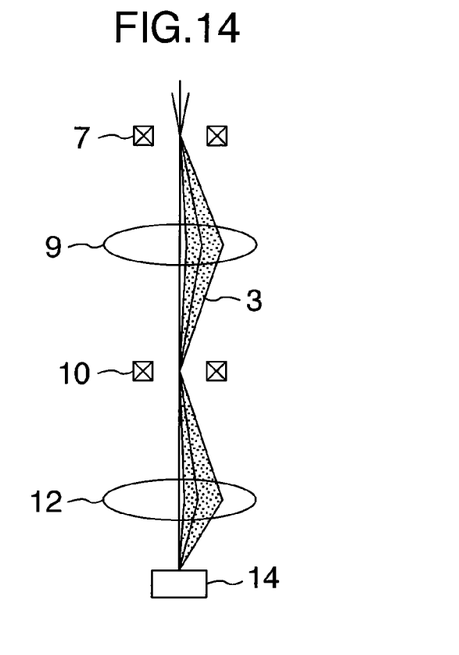
FIG. 14 is a schematic electron ray diagram showing another example of optical system according to the invention.

The configuration of FIGS. 14 and 15 is identical with the optical system of FIGS. 2, 5A, and 5B. Note that only one stage of the second beam tilt angle control coil 10 is shown.

A specific method of correcting the comatic aberration and off-axis chromatic aberration is to cancel out aberrations produced off the axes of plural condenser lenses including the objective lens. FIG. 15 is a schematic electron ray diagram illustrating a crossover type method of correcting aberrations.
(A) Conditions Under Which Comatic Aberration is Reduced It is assumed that the aberration correction lens (third condenser lens) 9 achieves a beam tilt angle of $\theta 1$ and a beam convergence angle of $\alpha 1$. It is also assumed that the objective lens 12 achieves a beam tilt angle of $\theta i$ and a beam convergence angle of $\alpha i$. Fundamental relational formulas are defined as given by (2) and (3) below.

$$\alpha 1 = \frac{1}{M\alpha \cdot \alpha i} \quad (2)$$

$$\theta 1 = K \cdot \theta i \quad (3)$$

where $M\alpha$ is the angular magnification of the objective lens and K is a proportional constant. Eq. (2) is a relational formula about the angular aperture in an electron optical system.

Comatic aberration $\Delta WRL$ produced in the crossover-type electron optical system is given by $$\Delta WRL = Csi \cdot \theta i \cdot \alpha i^2 + M \cdot Cs1 \cdot \theta 1 \cdot \alpha 1^2 \quad (4)$$

where Csi is the spherical aberration in the objective lens 12, M is the demagnification factor of the objective lens 12, and Cs1 is the spherical aberration in the aberration correction lens 9.

Eq. (5) is obtained from Eq. (4).

$$\Delta WRL = (C_{si} + K \cdot M/M\alpha^2 \cdot C_{s1})\theta \cdot \alpha i^2 \quad (5)$$

Setting the inside of the parentheses of Eq. (5) to 0 results in conditions under which comatic aberration is reduced as given by Eq. (6).

$$K = -M\alpha^2 \cdot C_{si}/M \cdot C_{s1} \quad (6)$$

(B) Conditions Under Which Off-Axis Chromatic Aberration is Reduced

Off-axis chromatic aberration $\Delta Wcl$ produced in the crossover-type electron optical system is given by Eq. (7).

$$\Delta Wcl = C_{ci} \cdot \Delta V/Vi \cdot \theta i + M \cdot C_{c1} \cdot \Delta V/V1 \cdot \theta 1 \quad (7)$$

where $C_{ci}$ is the chromatic aberration in the objective lens and $\Delta V$ indicates the variation in the voltage $V_i$ applied to the objective lens 12 and the variation in the voltage V1 applied to the aberration correction lens.

Eq. (8) is obtained from Eq. (7).

$$\Delta Wcl = (C_{ci} \cdot \Delta V/Vi + K \cdot M \cdot C_{c1} \cdot \Delta V/V1) \cdot \theta i \quad (8)$$

Setting the inside of the parentheses of Eq. (8) to 0 results in conditions under which off-axis chromatic aberration is reduced as given by Eq. (9).

$$K = -C_{ci}/M \cdot C_{c1} \quad (9)$$

It can be seen from Eqs. (6) and (9) that the conditions under which comatic aberration and off-axis chromatic aberration are canceled simultaneously are given by Eq. (10).

$$C_{si}/C_{ci} = C_{s1}/M\alpha^2 \cdot C_{c1} \quad (10)$$

When Eq. (10) above holds, the conditions dictate that the primary electron beam tilted in the objective lens 12 simultaneously cancel out the comatic aberration and off-axis chromatic aberration produced by the off-axis incidence. However, where it is difficult to satisfy the relational formula by the operative condition, configuration, and shape of the lens, the optical system is designed in such a way that deterioration of the resolution can be suppressed to a minimum by placing emphasis on cancellation of only one of the comatic aberration and off-axis chromatic aberration.

Figure 10:
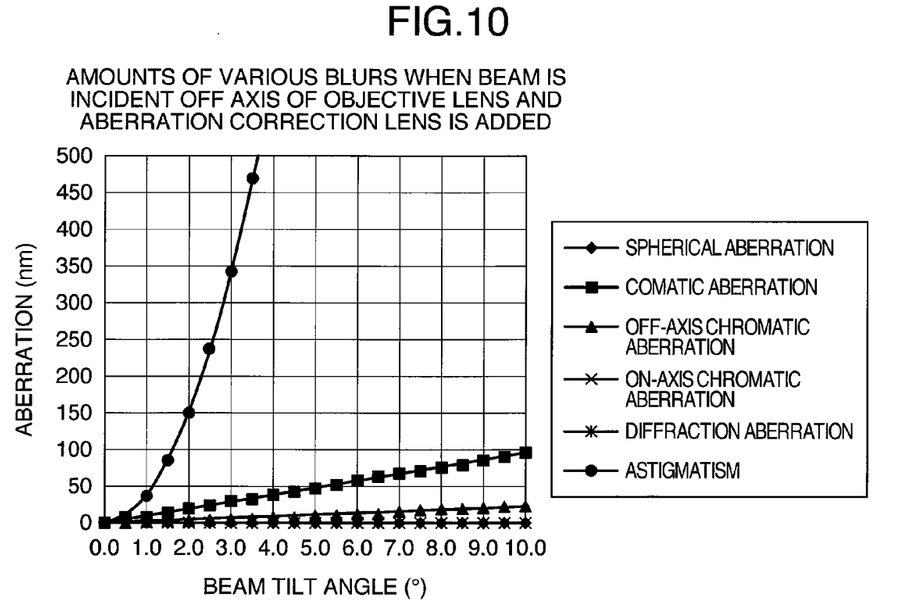
FIG. 10 is a graph in which the amounts of various aberration-induced blurs are plotted against beam tilt angle in a case where an aberration correction lens is added and where the beam is off-axis incident on the objective lens.

FIG. 10 is a graph showing the amounts of blurs produced when the primary electron beam 3 impinges at an off-axis position of the objective lens off the principal axis of the objective lens under the condition where the aberration correction lens (third condenser lens) 9 is added as described previously. It can be seen that the blur due to comatic aberration and blur due to off-axis chromatic aberration are reduced as compared with the respective blurs (graph of FIG. 9) produced when only the objective lens is used without aberration correction as described above.

The amounts by which the currents in the first beam tilt angle control coil (deflection coil) 7 and in the second beam tilt angle control coil (deflection coil) 10 are controlled are set according to the beam tilt angle using a predetermined relationship of Eq. (10) above. Ideally, off-axis aberrations (chromatic aberration and comatic aberration) in the objective lens 12 are canceled out by off-axis aberrations in the condenser lens 9. Furthermore, in the present embodiment, in-phase variations $\Delta I_i$ and $\Delta I_1$ are simultaneously given to the amplitudes of the excitation currents for the objective lens and aberration correction lens to prevent the optical axis from being shifted by control errors caused, for example, by variations in the objective lens and aberration correction lens. The optical axis is adjusted or controlled so as to satisfy the following relationship:

$$\Delta I_1/I_1 = \Delta I_i/I_i$$

That is, the optical axis is adjusted at a ratio determined in a corresponding manner to the energy of the charged particle beam passing through each lens in the charged particle optical system.

Means that are considered useful in performing stereoscopic imaging with the configuration described so far are next described.

The aperture 6 limiting the angular aperture of the primary electron beam and the beam current impinging on the specimen is disposed at a position where none of the angular aperture and beam current depend on the beam tilt as shown in FIG. 2. Specifically, the aperture 6 and the deflection coil (first beam tilt angle control coil) 7 for aberration correction are arranged in this order in the upper stage close to the aberration correction lens 9. Consequently, none of the beam angular aperture and beam current determining the resolution depend on the beam tilt over the specimen. Hence, it is easy to set the optimum conditions for beam angular aperture, beam current, and beam tilt.

The deflection coil (second beam tilt angle control coil) 10 for forming a parallactic angle can accurately control the beam by experimentally finding the relation between the tilt angle of the beam over the specimen and the dynamic sensitivity of the coil and setting the beam scan speeds at the left and right tilt angles on each line based on the experimentally found value. It is possible to cope with the normal control range of 0.3 to 30 kV of acceleration voltages of SEM by providing interconnected control for each value of the energy (in this example, the acceleration voltage) of the beam passing through the coil.

Figure 12:
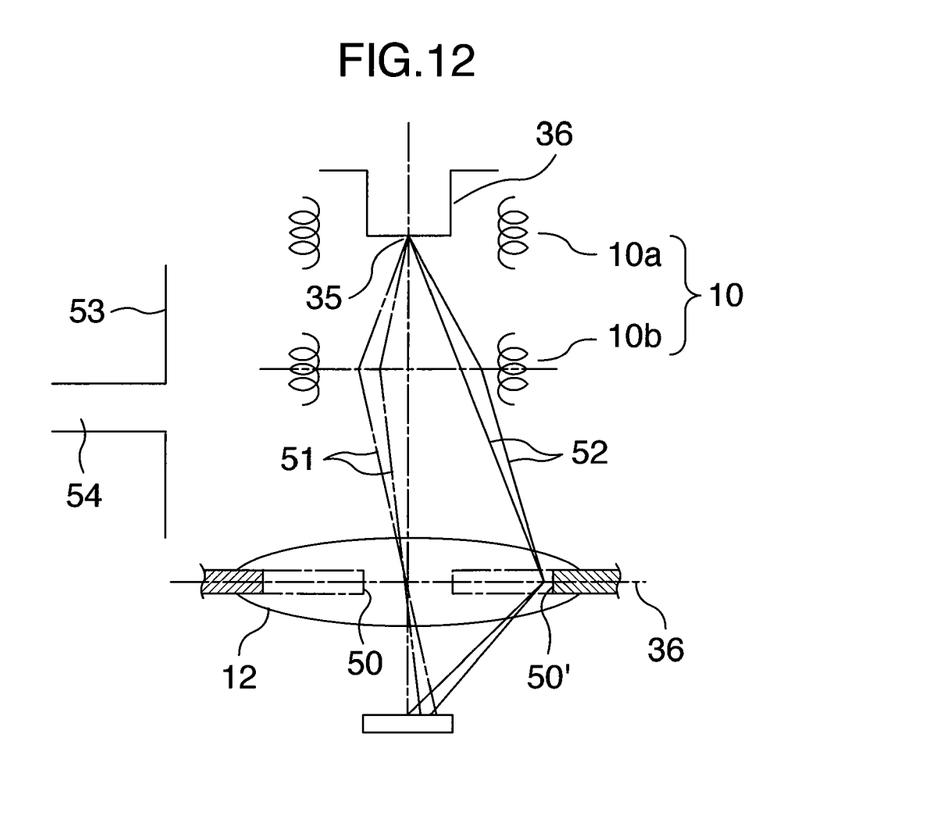
FIG. 12 is an electron ray diagram showing the relationship between the prior art differential aperture and a differential aperture associated with an embodiment of the present invention under the condition where a differential pumping aperture is placed at the position of the principal plane of the objective lens.
Figure 13A:
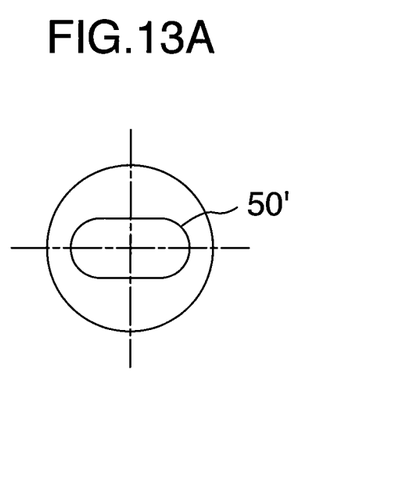
FIGS. 13A and 13B are plan views showing examples of the shape of the differential pumping aperture.
Figure 13B:
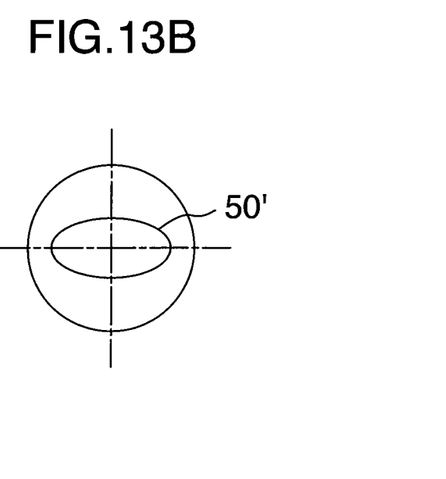

FIG. 12 is an electron ray diagram illustrating the manner in which a charged particle beam apparatus capable of real-time stereoscopic imaging as described above is applied to imaging at low vacuum levels of 1 to 3,000 Pa. FIGS. 13A and 13B show examples in which the shape of a differential pumping aperture necessary to create a differential pressure between the inside of a lens and a specimen chamber is made to correspond to the beam tilt.

In many technical fields where stereoscopic imaging performed by the scanning electron microscope of the embodiment described previously is required, nonconductive specimens are treated such as in biological and textile applications. It is generally said that many of the nonconductive specimens are coated with a conductive material. However, some specimens contain moisture and thus it is difficult to coat them. Other specimens are deformed by a high vacuum. In this way, various specimens are present. For the means for imaging these specimens, means which controls the inside of the specimen chamber of a low-vacuum scanning electron microscope down to the aforementioned low-vacuum ambient and which employs electrical neutralization at the surface of the specimen can be used very advantageously.

The advantage of a low vacuum is that negative electric charges (electrons) accumulated on the surface of the specimen due to electron scanning are neutralized by positive ions of the molecules of residual gas, thus preventing charge-up.

Generally, in a low-vacuum scanning electron microscope, a differential pumping aperture is mounted close to the principal plane of the objective lens to maintain the inside of the specimen chamber in a low-vacuum ambient. The prior art differential pumping aperture is indicated by 50 and dot-and-dash lines in FIG. 12. The aperture 50 is placed at the principal plane 36 of the objective lens 12. The inside of the specimen chamber which is located outside the microscope (outside the housing of the optical system) is bordered by the differential pumping aperture 50 and maintained in a low vacuum. The inside of the housing of the optical system is pumped down to maintain the inside in a medium or high vacuum (e.g., $10^{-3}$ to $10^{-4}$ Pa). A suction passage 54 is formed in the housing 53 for the vacuum pumping as schematically shown in FIG. 12.

In the conventional general method of control, scanning of an electron beam or charged particle beam is controlled such that the optical axis of the beam passes through the axis of an objective lens as indicated by reference numeral 51. In this case, the differential pumping aperture 50 only needs to have a small size. For example, it is a circular hole of about 0.35 mm in diameter. On the other hand, in a stereoscopic imaging mode as in the present embodiment for acquiring left and right parallax images, if the aperture 50 has a conventional size to permit a tilted primary beam (charged particle beam) incident on the objective lens 12 to enter off the axis of the objective lens 12 as indicated by 52, then limitations are imposed on the tilt angle of the beam. Accordingly, we have devised a configuration which permits imaging in a low-vacuum ambient and which can meet demands in broader technical fields by optimizing the position and shape of the differential aperture.

Figure 11:
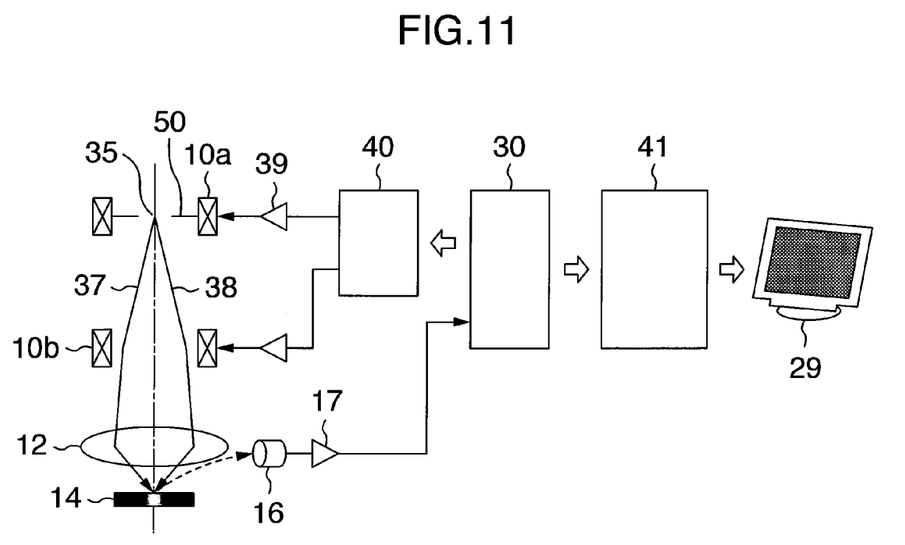
FIG. 11 is a block diagram of another apparatus according to the invention, and in which a differential pumping aperture is disposed in the pivot point of rocking motion.

Its one example is shown in FIG. 11, where the differential pumping aperture 50 is disposed not at the position of the principal plane of the objective lens 12 but close to the beam-rocking point 35. The differential pumping aperture is spaced from the principal plane of the objective lens, i.e., from the position of the specimen. This means that the beam makes a long flight through an area at a low-vacuum level (1 to 3,000 Pa). Because the beam is scattered, it is impossible to obtain an optimum image. An improvement can be made by pumping down the spaces, where a differential pumping aperture located close to the rocking point and the principal plane of the objective lens are located respectively, by separate vacuum pumps. Also shown in FIG. 11 are a beam tilt angle control amplifier 39 for amplifying an electrical current used for control of the beam tilt angle, a beam tilt control circuit 40, and a parallax image data processing unit 41 for acquiring left and right tilt angle images.

A method of avoiding interference of the aperture with the off-axis incidence on the objective lens (i.e., limitation on the tilt angle) at the conventional position of the differential pumping aperture (position of the principal plane 36 of the objective lens) without adopting the modification to the position of the differential pumping aperture as shown in FIG. 11 is described by referring to FIGS. 12, 13A, and 13B. This method can be implemented using an aperture 50' shaped into a slot, for example, having an elliptical or almost elliptical form so as to comply with the off-axis incidence (i.e., the beam is spaced from the axis of the objective lens) caused by beam tilt. In this case, the aperture 50' in the form of the slot has a lateral dimension of 0.35 mm and a longitudinal dimension of about 1 mm, for example. These dimensions can be modified according to the need as long as the function of the differential pumping aperture can be maintained.

A method of acquiring left and right parallax images as described above and displaying them as a stereoscopic image on the display device 29 (such as a 3D LCD) is next described.

Stereoscopic imaging that is known from the past is making a shift from a technique using dedicated glasses or goggles to a technique permitting stereoscopic viewing with the naked eyes. Generally, in gaming and media viewing applications, dedicated video glasses or goggles may be used at all times to implement three-dimensional imaging. In a charged particle beam apparatus, manipulations not associated with stereo imaging such as for adjustments of the apparatus and settings of imaging conditions need to be repeated frequently, as well as manipulations for the stereo imaging. Therefore, if dedicated glasses or goggles are used, it is cumbersome to put on and off them. It is desired to achieve naked-eye stereoscopic viewing.

Naked-eye 3D LCDs are classified into two major categories according to type of technique. In one category, a liquid crystal shutter shaped like a slit and known as a parallax barrier is mounted inside an LCD panel. An array of data items corresponding to a left or right eye is formed for each individual pixel according to the parallax barrier. In the other category, a hog-backed beam-splitting lens (lenticular lens) having directivity is mounted on the front face of an LCD panel. Image data items corresponding to a left or right eye are arrayed according to the lens for each individual pixel. To achieve stereoscopic viewing with these 3D LCDs, data about pixels forming the left and right parallax images may be entered according to the pixel array on the display. According to the present invention, image data sets corresponding to left and right parallax images are detected alternately on each scanning line. Therefore, real-time stereoscopic viewing is achieved by recording data about pixels of the left and right parallax images into line memories for two lines of data, converting the arrays, and producing an output according to the display rate of the display device.

An example of stereoscopic imaging using a 3D LCD has been described so far. A method of achieving stereoscopic imaging more easily is next described. Images corresponding to a left-right parallax are arrayed side by side. The left and right parallax images are viewed by corresponding eyes by crossed eye viewing (also known as crossed eye method or parallel eye method) or by diverged eye viewing. The images are made to overlap each other, resulting in stereopsis. In this case, it is only necessary that image data corresponding to a left-right parallax and entered for each one scanning line at a time be arranged left and right in two dimensions. Another method is to use anaglyph red/blue glasses. The colors of the glasses are imparted respectively to the left and right parallax images. The images are superimposed and displayed on a general display device.

In the above-described charged particle beam apparatus, in cases where the final magnification is low (e.g., ×10,000 or lower), the aforementioned tilted beam scanning corresponding to a left-right parallax is carried out in real time to enable stereoscopic imaging. Where the final magnification is high (e.g., ×10,000 or higher), a switching function can be added to perform beam scanning without tilting the beam according to a parallactic angle. That is, the apparatus is operated as a normal charged particle beam apparatus. At high magnifications, limitations are placed on control of the amounts of blurs. It is considered that natural three-dimensional representation is not done. Accordingly, greater ease of use is provided by arranging the aberration correction lens in the whole optical system such that the lens can also be used for normal SEM and permitting the mode of operation to be automatically switched between real time imaging and normal high-magnification imaging according to the final magnification.

Figure 7:
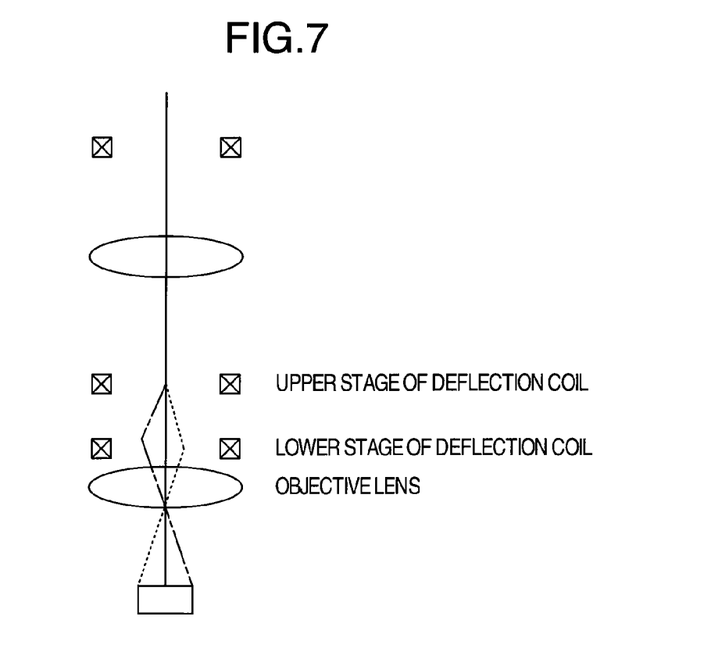
FIG. 7 is a schematic electron ray diagram showing the central orbit (optical axis) of the beam in a case where the apparatus operates in a normal scanning mode (two-dimensional imaging mode)
Figure 8:
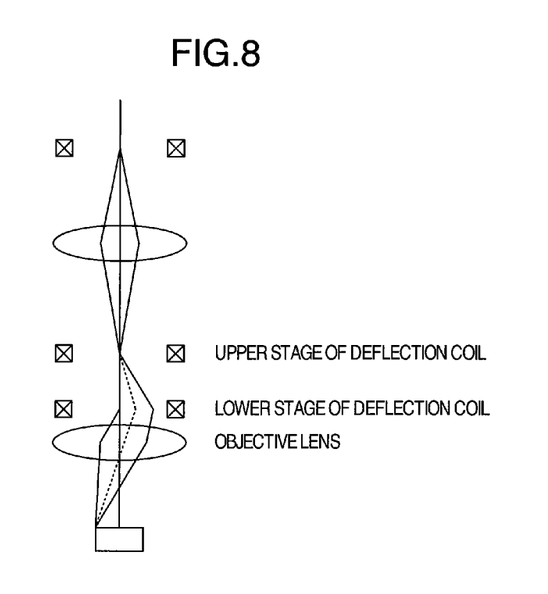
FIG. 8 is an electron ray diagram showing an example of spread of the beam and an example of focused condition in a case where the apparatus operates in the scanning mode shown in FIG. 7.

Referring to the circuit diagrams of FIGS. 5A and 5B, an imaging mode switch 60 is used to switch the mode of operation between 3D imaging mode in which the parallax images are acquired and normal scanning mode (2D imaging mode). When the switch 60 is closed (ON), the beam tilt angle is switched alternately between left and right tilt angles on each horizontal scanning line by another switch 61. FIG. 7 shows the central orbit (optical axis) of the beam assumed in normal scanning mode (2D imaging mode). In this case, the optical axis passes through the central axis of the objective lens. FIG. 8 shows one example of the spread of the beam under this condition. Also, an example of focal condition is shown.

In the above embodiments, the beam scanned according to a parallactic angle is a primary electron beam. The present invention can also be similarly applied to an apparatus employing a charged particle beam (such as an ion beam).

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A charged particle beam apparatus having a charged particle beam source producing a primary charged particle beam, a charged particle optical system including plural lenses and acting to focus the primary charged particle beam and to scan the beam over a specimen, detection means for detecting secondary charged particles produced from the specimen in response to the scanning of the primary charged particle beam and producing a detection signal indicating the secondary charged particles, and a control unit for controlling the lenses, the charged particle beam apparatus being adapted to acquire an image of the specimen using said detection signal from the detection means, wherein said control unit has: parallactic angle scanning control means for setting, via the charged particle optical system, a left tilt angle and a right tilt angle corresponding to a parallactic angle for the primary charged particle beam impinging on the specimen and controlling scanning of the primary charged particle beam such that the left tilt angle and the right tilt angle are given to the beam alternately for each one scanning line over the specimen; and parallax image formation means for acquiring left and right parallax images based on the detection signal produced from the detection means under the control of the scanning of the beam.

2. A charged particle beam apparatus as set forth in claim 1, wherein said parallactic angle scanning control means controls scanning of said primary charged particle beam over the specimen such that the beam makes a first scan at the left tilt angle corresponding to the parallactic angle and a second scan at the right tilt angle on each scanning line.

3. A charged particle beam apparatus as set forth in claim 1, wherein said control unit has an imaging mode-switching function which, when a final magnification is less than an arbitrarily set given magnification, switches mode of operation of the apparatus to stereoscopic imaging mode where the scanning of the charged particle beam is controlled via said parallactic angle scanning control means such that the left and right tilt angles corresponding to the parallactic angle are given to the beam alternately for each scanning line and real-time stereoscopic imaging based on the left and right parallactic images acquired by the parallax image formation means is implemented on a display device and which, when the final magnification is in excess of the given magnification, switches the mode of operation to normal two-dimensional imaging mode where none of the left and right tilt angles corresponding to the parallactic angle are given to the beam during the scanning.

4. A charged particle beam apparatus as set forth in claim 1, wherein an aberration correction lens for producing aberrations to correct off-axis aberrations in an objective lens produced by the scanning of the charged particle beam tilted by an angle corresponding to the parallactic angle is disposed in a stage located above the objective lens included in said charged particle optical system.

5. A charged particle beam apparatus as set forth in claim 4, wherein said aberration correction lens is operated based on a control value predetermined by said control unit and produces the aberrations for providing real-time cancellation of the off-axis aberrations in the objective lens produced by the scanning of the charged particle beam tilted by an angle corresponding to the parallactic angle.

6. A charged particle beam apparatus as set forth in claim 1, wherein there are further provided: an aperture for determining an angular aperture of the beam over the specimen and a specimen current; and electromagnetic coils for forming deflection angles corresponding to the left tilt angle and right tilt angle required over the specimen; and wherein said aperture and said electromagnetic coils cooperate to form means causing the left tilt angle and the right tilt angle corresponding to the parallactic angle of said primary charged particle beam to be given to the beam.

7. A charged particle beam apparatus as set forth in claim 1, wherein said parallactic angle scanning control means interlocks the plural lenses of said charged particle optical system and electromagnetic coils for giving the left tilt angle and the right tilt angle corresponding to the parallactic angle to the beam using control values predetermined to acquire the left and right parallax images.

8. A charged particle beam apparatus as set forth in claim 1, further comprising adjustment means for adjusting optical axes at ratios determined in a corresponding manner to energies of the charged particle beam passing through the lenses of said charged particle optical system.

9. A charged particle beam apparatus as set forth in claim 1, wherein a differential pumping aperture is disposed at a position where the charged particle beam controlled to have the left and right tilt angles corresponding to the parallactic angle is not affected to permit observation of the image of the specimen at low vacuum levels of 1 to 3,000 Pa.

10. A charged particle beam apparatus as set forth in claim 9, wherein said differential pumping aperture is disposed near a principal plane of a final stage of lens included in said charged particle optical system and has an elliptical form that covers an area remote from the axis of the charged particle optical system controlling the primary charged particle beam to have the left and right tilt angles corresponding to the parallactic angle.

11. A charged particle beam apparatus as set forth in claim 1, wherein there is further provided a liquid crystal display enabling real-time stereoscopic imaging based on the acquired left and right parallax images by a parallax barrier method or a lenticular method.

12. A charged particle beam apparatus as set forth in claim 1, wherein there is further provided a liquid crystal display enabling real-time stereoscopic imaging by displaying the acquired left and right parallax images on one display screen simultaneously and by the use of a crossed view method, parallel view method, or anaglyph method.

13. A charged particle beam apparatus having a charged particle beam source producing a primary charged particle beam, a charged particle optical system including plural lenses and acting to focus the primary charged particle beam and to scan the beam over a specimen, detection means for detecting secondary charged particles produced from the specimen in response to the scanning of the primary charged particle beam and producing a detection signal indicating the secondary charged particles, and a control unit for controlling the lenses, the charged particle beam apparatus being adapted to acquire an image of the specimen using said detection signal from the detection means, wherein said control unit has: parallactic angle scanning control means for setting, via the charged particle optical system, a left tilt angle and a right tilt angle corresponding to a parallactic angle for the primary charged particle beam impinging on the specimen and controlling scanning of the primary charged particle beam such that the left tilt angle is given to the beam when it scans over odd- or even-numbered scanning lines over the specimen and that the right tilt angle is given to the beam when it scans over even- or odd-numbered scanning lines; and parallax image formation means for acquiring left and right parallax images based on the detection signal produced from the detection means under the control of the scanning of the beam.

14. A charged particle beam apparatus as set forth in claim 13, wherein said control unit has an imaging mode-switching function which, when a final magnification is less than an arbitrarily set given magnification, switches mode of imaging of the apparatus to stereoscopic imaging mode where the scanning of the primary charged particle beam over the specimen is controlled via said parallactic angle scanning control means such that the left tilt angle of the parallactic angle is given to the beam when it scans over odd- or even-numbered scanning lines and the right tilt angle corresponding to the parallactic angle is given to the beam when it scans over even- or odd-numbered scanning lines and real-time stereoscopic imaging based on the left and right parallactic images acquired by the parallax image formation means is implemented on a display device and which, when the final magnification is in excess of the given magnification, switches the mode of operation to normal two-dimensional imaging mode where none of the left and right tilt angles corresponding to the parallactic angle are given to the beam during the scanning.

15. A charged particle beam apparatus as set forth in claim 13, wherein an aberration correction lens for producing aberrations to correct off-axis aberrations in an objective lens produced by the scanning of the charged particle beam tilted by an angle corresponding to the parallactic angle is disposed in a stage located above the objective lens included in said charged particle optical system.

16. A charged particle beam apparatus as set forth in claim 15, wherein said aberration correction lens is operated based on a control value predetermined by said control unit and produces the aberrations for providing real-time cancellation of the off-axis aberrations in the objective lens produced by the scanning of the charged particle beam tilted by an angle corresponding to the parallactic angle.

17. A charged particle beam apparatus as set forth in claim 13,
wherein there are further provided: an aperture for determining an angular aperture of the beam over the specimen and a specimen current; and electromagnetic coils for forming deflection angles corresponding to the left tilt angle and right tilt angle required over the specimen; and
wherein said aperture and said electromagnetic coils cooperate to form means causing the left tilt angle and the right tilt angle corresponding to the parallactic angle of said primary charged particle beam to be given to the beam.

18. A charged particle beam apparatus as set forth in claim 13, wherein said parallactic angle scanning control means interlocks the plural lenses of said charged particle optical system and electromagnetic coils for giving the left tilt angle and the right tilt angle corresponding to the parallactic angle to the beam using control values predetermined to acquire the left and right parallax images.

19. A charged particle beam apparatus as set forth in claim 13, further comprising adjustment means for adjusting optical axes at ratios determined in a corresponding manner to energies of the charged particle beam passing through the lenses of said charged particle optical system.

20. A charged particle beam apparatus as set forth in claim 13, wherein a differential pumping aperture is disposed at a position where the charged particle beam controlled to have the left and right tilt angles corresponding to the parallactic angle is not affected to permit observation of the image of the specimen at low vacuum levels of 1 to 3,000 Pa.

* * * * *